United States Patent
Verret

Patent Number: 6,130,144
Date of Patent: Oct. 10, 2000

[54] METHOD FOR MAKING VERY SHALLOW JUNCTIONS IN SILICON DEVICES

[75] Inventor: Douglas P. Verret, Sugar Land, Tex.

[73] Assignee: Texas Instruments Incorporated, Dallas, Tex.

[21] Appl. No.: 08/999,090

[22] Filed: Dec. 29, 1997

Related U.S. Application Data

[60] Provisional application No. 60/035,725, Jan. 2, 1997.

[51] Int. Cl.$^7$ ........................................ H01L 21/22
[52] U.S. Cl. ............... 438/542; 438/510; 438/DIG. 920; 438/DIG. 923
[58] Field of Search .................... 438/510, 511, 438/542, 558, 564, 514, 482, 486, 310, DIG. 920, DIG. 923, FOR 461

[56] References Cited

U.S. PATENT DOCUMENTS

| | | | |
|---|---|---|---|
| 3,664,896 | 5/1972 | Duncan | 148/187 |
| 4,920,076 | 4/1990 | Holland et al. | 437/238 |
| 5,126,805 | 6/1992 | Bulat et al. | 357/22 |
| 5,162,246 | 11/1992 | Ozturk et al. | 437/41 |
| 5,296,387 | 3/1994 | Aronowitz et al. | 437/24 |
| 5,453,389 | 9/1995 | Strain et al. | 437/31 |
| 5,571,744 | 11/1996 | Demirlioglu et al. | 437/57 |
| 5,624,867 | 4/1997 | Cheng et al. | 438/560 |
| 5,656,859 | 8/1997 | Murakoshi et al. | 257/750 |
| 5,795,808 | 8/1998 | Park | 438/301 |

OTHER PUBLICATIONS

Wolf, Silicon Processing for the VLSI Era Volume 1—Process Technology, Lattice Press, pp. 261–262, 1986.

Lu et al., "Process Limitation and Device Design Tradeoffs of Self–Aligned TiSi2 Junction Formation in Submicrometer CMOS Devices," *IEEE Transactions on Electron Devices*, vol. 38, No. 2, Feb. 1991, pp. 246–254.

Hong et al., "Material and Electrical Properties of Ultra–Shallow p+–n Junctions Formed by Low–Energy Ion Implantation and Rapid Thermal Annealing," *IEEE Transactionis on Electron Devices*, vol. 38, No. 3, Mar. 1991, pp. 476–486.

Wang et al., "Ultra–Shallow Junction Formation Using Silicide as a Diffusion Source and Low Thermal Budget," *IEEE Transactionis on Electron Devices*, vol. 39, No. 11, Nov. 1992, pp. 2486–2496.

Ozturk, et al., "Rapid Thermal Chemical Vapor Deposition of Germanium on Silicon and Silicon Dioxide and New Applications of Ge in ULSI Technologies", *Journal of Electronic Materials*, vol. 19, No. 10, Oct. 1990, pp. 1129–1134 XP 000197935.

D, Fathy, et al., "Formation of Epitaxial Layers of Ge on Si Substrates by Ge Implantation and Oxidation", *Applied Physics Letters*, vol. 51, No. 17, Oct. 26, 1987, pp. 1337–1339 XP002096974.

A.R. Srivatsa, et al., "Nature of Interfaces and Oxidation Processes in Ge+– Implanted Si", *Journal of Applied Physics*, vol. 65, No. 10, May 15, 1989, pp. 4028–4032 XP002096975.

*Primary Examiner*—Charles Bowers
*Assistant Examiner*—Evan Pert
*Attorney, Agent, or Firm*—Jacqueline J. Garner; Wade James Brady, III; Frederick J. Telecky, Jr.

[57] ABSTRACT

A processing method for forming very shallow junctions 25 utilizing the differential diffusion coefficients of impurity dopants 38 in germanium as compared to silicon to confine the dopants 38 to very shallow regions made of substantially pure germanium 34. This processing method takes advantage of known and reliable process steps to create thin layers of Ge 34 with well-controlled thicknesses by conventional methods. The processing method includes the steps of forming a film layer of germanium of a desired thickness on the substrate 28; introducing a dopant material to the germanium film layer 34; and diffusing the dopant material in the germanium film layer 34.

19 Claims, 2 Drawing Sheets

6,130,144

METHOD FOR MAKING VERY SHALLOW JUNCTIONS IN SILICON DEVICES

This application claims priority under 35 USC §119(e)(1) of provisional application number 60/035,725 filed Jan. 2, 1997.

BACKGROUND OF THE INVENTION

1. Field of Invention

This invention relates to semiconductor processing technology, and more particularly to the use of conventional processing technology to form very shallow junctions.

2. Relevant Background

In conventional deep submicron MOSFET, and other silicon devices, expansion of the drain potential into the channel region can result in short-channel effects. Regarding MOSFET devices, an ideal MOSFET has a junction depth of zero, and as a result has the least severe short-channel behavior. Thus, a conventional deep sub-micron transistor exhibits close to ideal performance characteristics when the source/drain (S/D) junctions are very shallow.

Very shallow junctions (<500 Å) with low leakage characteristics are very difficult to achieve with conventional semiconductor processing methods. More complex semiconductor processing methods, such as pre-amorphizing implants, sub-gate sidewall spacers or elevated S/D's are required to obtain adequately shallow junctions.

As semiconductor devices continue to reduce in scale, there are pressures to make junctions more shallow. Deep junctions result in an increase in the undesired short channel effects. Also, the overlap of S/D's onto the gate increases as the junction becomes deeper because of lateral diffusion. Large overlaps result in large overlap capacitance, which is a key parasitic characteristic that inhibits the intrinsic speed of MOS devices.

As devices scale from one generation to the next, large overlaps can be problematic. In general, large overlaps imply small effective lengths ($L_{eff}$'s) for a fixed gate length. When $L_{eff}$'s are small, channel concentration must increase to avoid pre-mature punch-through and to mitigate the drain induced barrier lowering (DIBL) effect. As channel concentrations increase, several deleterious effects can occur. These can include that channel mobilities degrade and reduce transistor gain; junction capacitance increases and reduces switching speed; junction breakdown decreases; body effect increases; and the temperature coefficient of threshold voltage increases. All of these factors improve as $L_{eff}$ increases, and the channel concentration decreases for a fixed physical gate length.

$L_{eff}$ can increase as the junctions become more shallow because of the reduced lateral diffusion, which is directly dependent on the depth of the junction. Thus, shallow junctions are highly desirable for deep sub-micron MOS devices. Similar arguments can be made for the desirability of shallow emitters and bases for bipolar devices.

With respect to reliability considerations, the low channel concentrations which accrue from shallow functions also act to reduce gate-induced drain leakage (GIDL) and the maximum electrical field ($E_{max}$) at the drain. Reduced $E_{max}$ improves channel hot carrier (CHC) degradation immunity.

Present art using ion implantation even with pre-amorphizing implants, implant masking layers, and out-diffusion from dielectrics, metals and silicides are not readily capable of producing high concentration shallow P-N junctions. Pre-amorphizing implants eliminate ion channelling and reduce straggle but do not eliminate transient enhanced diffusion and long implant tails. Out-diffusion methods do not produce sufficiently high dopant concentrations, or are non-uniform, which produce leaky junctions.

Much attention has been paid to efforts aimed at finding feasible methods of manufacturing very shallow junctions, and to addressing the attendant problems and limitations associated therewith. It has been found that boron (B), $BF_2$, phosphorous (P) and arsenic (As) cannot be driven from $TiSi_2$ to form an adequate shallow junction. Thickness (x-ness) non-uniformity and thinning near the gate makes "drive-out" not feasible. For direct implantation into Si, implant damage (except for B) cannot be effectively annealed out at less than approximately 900° C. Therefore, one must implant into silicide, which has inherent limitations on concentration. The result indicated that post-junction silicidation may not be able to be performed below the 0.5 $\mu$m technology node.

It has also been found that one can recrystallize he amorphous region by performing solid phase epitaxy (SPE) at 550° C. for 30 minutes, but a higher temperature is needed for fluorine (F)-implanted samples because F inhibits SPE. F inhibits SPE because it binds to crystal defects retarding SPE and B activation. It has been found that the junction thickness, $x_j$, is approximately 0.11$\mu$ for a 1.35 KeV B implant, and 6 KeV BF2 when activated by rapid thermal annealing at 1050° C. for 10 seconds. $X_j$ is approximately 0.075$\mu$ when used with a 27 KeV germanium (Ge) pre-amorphized substrate. Complete activation has been observed at 27 KeV Ge for rapid thermal annealing at temperatures as low as 600° C. The temperature for defect removal is always higher than the temperature for activation.

In addition, it has been found that out-diffusion from $CoSi_2$ with rapid thermal annealing for 10 seconds at 800° C. produces an 8 nm $x_j$ for $N^+$ and 23 nm $x_j$ for $P^+$ junctions at 900° C., with the junction being conformal to the Si/silicide interface. A 500° C. anneal reduces leakage for all energies. For $P^+$-N junctions, lower energies need higher annealing temperatures. The F from $BF_2$ acts to passivate any defects. For $N^+$-P junctions, 15 KeV has 10 times the leakage due to agglomeration of silicide, which acts to spike the junction. Low energy As was found to be more difficult to anneal because As diffusion is almost totally through grain boundaries and high concentrations are not achievable because of limited source concentrations. Furthermore, there is no F passivation, and any agglomeration has a greater effect on As.

Activation energy ($E_a$) for leakage current on $P^+$/N junctions produced from $CoSi_2$ out-diffusion is approximately 0.64 ev with a rapid thermal anneal at 600° C. for 10 seconds in comparison to 1.0 ev with a rapid thermal anneal at 800° C. for 10 seconds. This means that one has to anneal shallow junctions in Si at a minimum of 800° C. in order to avoid leaky junctions.

The above describes the shallowest junctions attainable by the present state-of-the-art and some of the associated problems and limitations. There is missing in the art a method, using conventional processing methods, of producing very shallow junctions having desirable performance characteristics.

SUMMARY OF THE INVENTION

The processing method of the present invention for forming very shallow junctions utilizes the differential diffusion coefficients of impurity dopants in a second material, such as germanium, as compared to a first substrate material, such as silicon, to confine the dopants to very shallow regions made up of substantially pure second material. This inventive processing method takes advantage of known and reliable process steps to create thin layers of certain materials, such as germanium, with well-controlled thicknesses by conventional means. The processing method of the present invention utilizes proven and well-established device structures and conventional integrated circuit process steps. Basically, this invention is independent of device structure. It can be applied to any Si device where shallow junctions are an advantage. Additionally, the processing method of the present invention is relatively simple and can be accomplished at relatively low temperatures, which is desirable for use with deep sub-micron technologies.

Generally, the invention includes a method for making shallow junctions of a desired dopant type in a first material comprising the steps of forming a film layer of a second material on a substrate formed of the first material, introducing a dopant material to the second material film layer, the dopant having a higher diffusivity in the second material than in the first material, and diffusing the dopant material in the second material film layer.

In addition, the invention includes a method as described above, further including the steps of introducing a second dopant material to the second material film layer, the second dopant material having a higher diffusivity in the second material than in the first material, and diffusing the second dopant material in the second material film layer.

In forming the second material layer that is substantially pure, the second material is first implanted into the first material substrate to form an alloy of the first and second materials. The alloy is then oxidized to form a substantially pure layer of the second material above the first material substrate, while simultaneously forming an oxide layer above the second material layer. The oxide layer is then removed to expose the substantially pure second material layer.

In further detail, the processing method of the present invention for making shallow junctions in a silicon substrate includes the steps of forming a film layer of germanium of a desired thickness on the substrate; introducing a dopant material to the germanium film layer; and diffusing the dopant material in the germanium film layer.

More specifically, the forming step can further include the steps of implanting germanium into the silicon substrate to form a silicon and germanium alloy; oxidizing the silicon and germanium alloy to form a substantially pure germanium layer above the silicon substrate, and an oxide layer above said germanium layer; and removing the oxide layer to expose the germanium layer.

A principal object of the present invention is to provide for the manufacture of a shallow junction using known semiconductor processing methods and procedures.

A more complete appreciation of the present invention and its scope can be obtained from the accompanying drawings, which are briefly described below, the following detailed description of presently preferred embodiments of the invention, and the appended claims.

DETAILED SPECIFICATION

Figure 1:
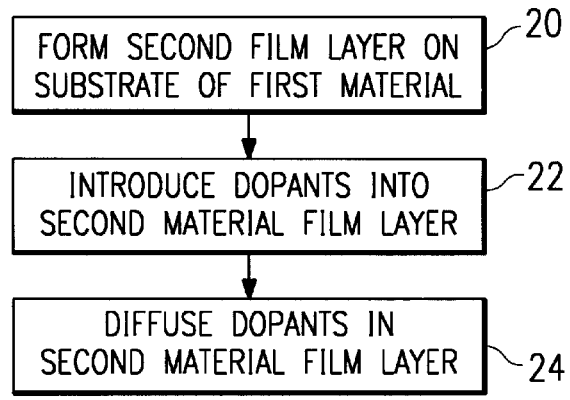
FIG. 1 is a block diagram illustrating the steps of the inventive process for making shallow junctions.

Referring first to FIG. 1, the basic steps encompassing the method of the present invention are shown. The steps include forming a film layer of a second material of desired thickness in the appropriate position on a substrate made of a first material 20, which is typically silicon (Si); introducing desired impurities or dopants into the second material film layer 22; and diffusing the dopant through the second material film layer to the desired extent 24, thus forming the junction. The second material is selected such that the dopants have a higher diffusivity in the second material than in the first substrate material, thus confining the dopant material in the second material layer during diffusion. The very shallow junction 25 is thus formed (See FIG. 4). The dopant material also has a higher differential activation percentage in the second material than in the first material, as explained below, such that upon an anneal of the appropriate temperature, the dopant is activated in the second material and not activated in the substrate material. More than one dopant can be introduced into the second material to be diffused or activated appropriately.

While the instant invention may be practiced with a variety of materials used in producing integrated circuits, for ease of description germanium is used as the second material and silicon is used as the first material in the following examples. Several different dopant materials are utilized in the examples given below.

More specifically, the steps include forming a film layer of germanium (Ge) of desired thickness in the appropriate position on the substrate, which is typically silicon (Si); introducing desired impurities or dopants into the Ge film layer; and diffusing the dopant through the Ge film layer to the desired extent, thus forming the junction.

The underlying principle of the method of the present invention is that most known dopants used in semiconductor technologies diffuse through Ge at a much higher rate than they diffuse through the Si. This principle combined with the fact that the diffusion characteristics of standard dopants in Ge are typically known, as is set forth below, and that the thickness of the Ge layer can be tightly controlled by known integrated circuit processing techniques, all result in the ability to create very shallow junctions having the desired performance characteristics. In sum, based on the differential diffusion rate of the dopants in Ge and silicon, the dopants can be diffused to the interface of the Ge layer and the substrate, at relatively low temperatures, with little diffusion of the dopant through the boundary into the substrate. The electrically active dopants are thereby substantially confined to the Ge film only. This process can thus be utilized to form very shallow and well defined junctions using known integrated circuit processing techniques, all at relatively low temperatures necessary for the manufacture of deep sub-micron MOS and other devices.

Regarding the formation of a Ge layer of desired thickness on the substrate, the preferred method, as schematically represented in FIG. 2, requires the preparation of a substrate with some percentage of Ge in the Si, for instance 50 atomic-percent, to form an alloy represented generally by $Si_xGe_{1-x}$. The $Si_xGe_{1-x}$ alloy can be obtained by any known method, such as implanting the Ge 26 into the Si substrate 28, as shown in FIG. 2a, or by a controlled epitaxial chemical vapor deposition, or by ultra-high vacuum chemical vapor deposition (UHVCVD). A blocking oxide can be used to control, or pattern, the location of the formation of the $Si_xGe_{1-x}$ alloy.

Figure 2A:
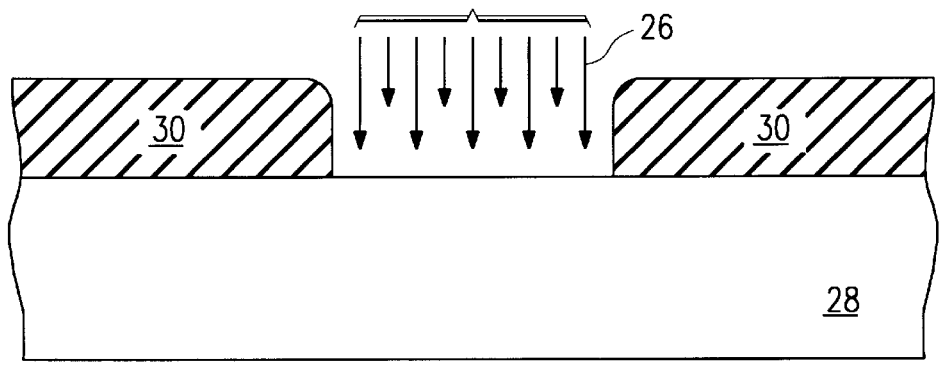
FIGS. 2a to 2d are a schematic representation of the formation of a substantially pure germanium film layer in the junction area pursuant to the inventive process.
Figure 2B:
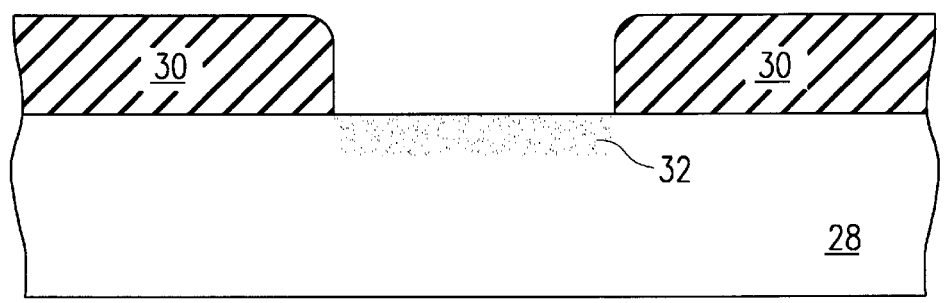
Figure 2C:
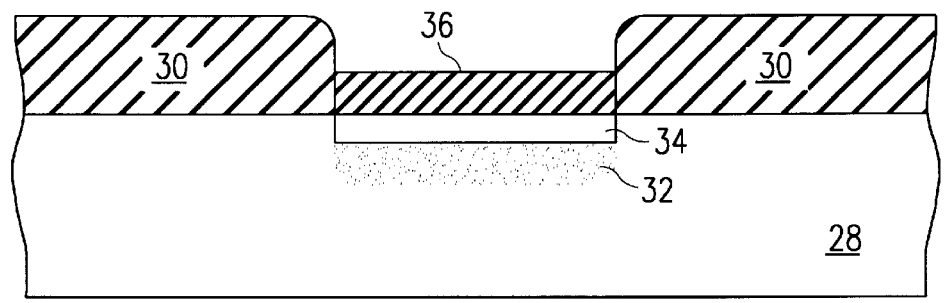

After the $Si_xGe_{1-x}$ alloy 32 is formed, as shown in FIG. 2b, the Ge layer of desired thickness is then formed by oxidizing the $Si_xGe_{1-x}$ alloy substrate, which produces an essentially pure layer of Ge 34 of well-controlled thickness, as shown in FIG. 2c. During the oxidation step, the oxide ($SiO_2$) layer 36 is formed by consuming the Si of the $Si_xGe_{1-x}$ alloy 32 without substantially disturbing the Ge in the $Si_xGe_{1-x}$ alloy underneath thereby forming a thin layer of essentially pure Ge 34. The oxidation step is preferably a steam oxidation step (to promote rapid oxide growth) at approximately 1000° C. As long as the resulting Ge film 34 is thin enough, it will not relax by plastic deformation to produce defects such as threading dislocations at the interface between the $Si_xGe_{1-x}$ and the Ge. Achievable Ge film thicknesses range from approximately 5 to 50 nanometers in depth.

Figure 2D:
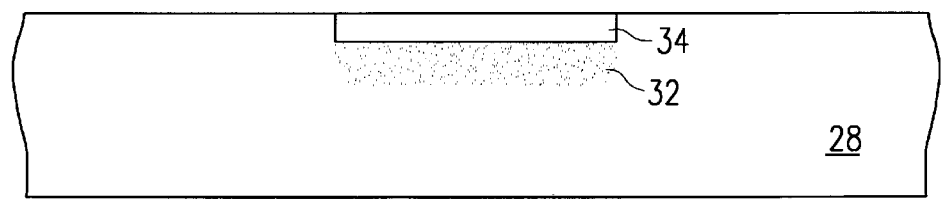

The resulting thickness of the Ge layer 34 is proportional to the oxidation time at 1000° C. and the percent of Ge in the underlying substrate 28, which allows for precise control of the thickness. For example, with the above provided 50 atomic-percent Ge in the underlying substrate 28, when the steam oxidation is performed at 1000° C. for approximately 5, 10, 20 and 30 minutes, oxide layers 36 are formed of approximately 250 Å, 750 Å, 1100 Å, 1600 Å thickness, respectively. Simultaneously, corresponding layers of substantially pure Ge 34 are formed under the oxide layer 36 with thicknesses of approximately 55 Å, 100 Å, 170 Å, and 230 Å, respectively. The thickness of the Ge film layer 34 can be controlled to a high degree of precision. Once the Ge layer 34 of the desired thickness is formed, the oxide layer 36, along with the blocking oxide 30, is removed by an hydrofluoric acid (HF) bath in a known manner to expose the newly formed Ge layer 34, as shown in FIG. 2d. The above implant/Ge layer formation is preferred because it is easier to confine the Ge to selected regions by this method. In addition, the purity and general epitaxial quality is better, the interface is cleaner, and the junction depth is easier to control at shallow levels.

Other methods of forming thin Ge film layers in the desired thicknesses are also adequate for the instant invention. Amorphous Ge can be deposited on a Si substrate by using a plasma-enhanced chemical vapor deposition (PECVD) system, or by the pyrolytic decomposition of germane in a plasma environment, or alternatively by use of a low pressure chemical vapor deposition (LPCVD) system. The deposition of Ge on a Si substrate by these processes is known in the industry.

The resultant Ge film, if deposited by any of these methods, is preferably left in amorphous form for more effective subsequent processing. Alternatively, the amorphous Ge can be annealed by a known process at 600° C. for 400 to 1800 seconds to form poly-crystalline Ge. The disadvantage of using crystalline Ge is that it is subject to the formation of defects (dislocations) due to lattice mismatch (approximately 4%) between the Si and Ge. These defects could result in leaky junctions. Nevertheless, some applications do not require single-crystal substrate material.

Figure 3:
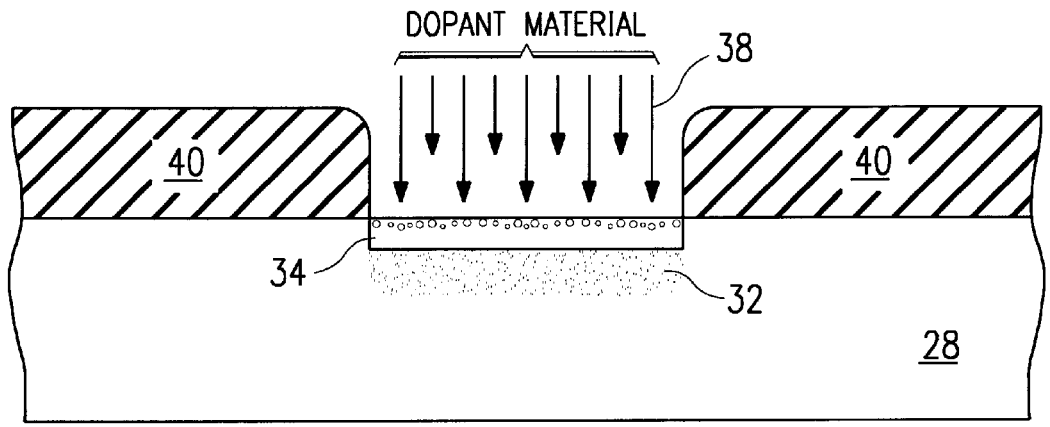
FIG. 3 is a schematic representation of the implantation of dopant material into the germanium film layer.

Once the substantially pure Ge film 34 is formed, one introduces an impurity or dopant 38, such as boron (B), by ion implantation or by other means, as shown in FIG. 3. The impurity dopant 38 of choice is thus implanted into the exposed Ge layer and typically substantially accumulates in the top portion of the Ge layer 34, as shown in FIG. 3. The Ge layer can be patterned either before the implant step, or after the Ge layer is formed for the case of epitaxial $Si_xGe_{1-x}$. In the latter case the excess Ge can be etched away by $H_2O_2$ or other Ge etchants. Thus the diode region is definable by conventional methods. A blocking oxide 40 is shown in FIGS. 3 and 4 as allowing the patterning of the regions that are to be exposed to the dopant.

The dopant can be introduced from in-situ doped poly-silicon or poly-germanium sources, or from poly-silicon films doped by the appropriate implant and anneal steps. The use of in-situ doped poly-germanium to introduce the dopant is preferred for low-temperature (e.g. approximately 400° C.) applications. However, poly-silicon is suitable for use at higher temperatures (e.g. $\geq 600°$ C.). Both processes would require high-temperature flash anneals (e.g. $\geq 900°$ C.) for implanted films in order to activate the dopant. Therefore, very shallow junctions are achievable when the dopant is diffused from implanted poly-crystalline sources, but this is not accomplished at low temperatures. The method of introduction of the dopant 38 into the Ge layer 34 is secondary to the teaching of this invention. Any known method of introducing the dopant into the Ge film at the adequate levels can be used.

Figure 4:
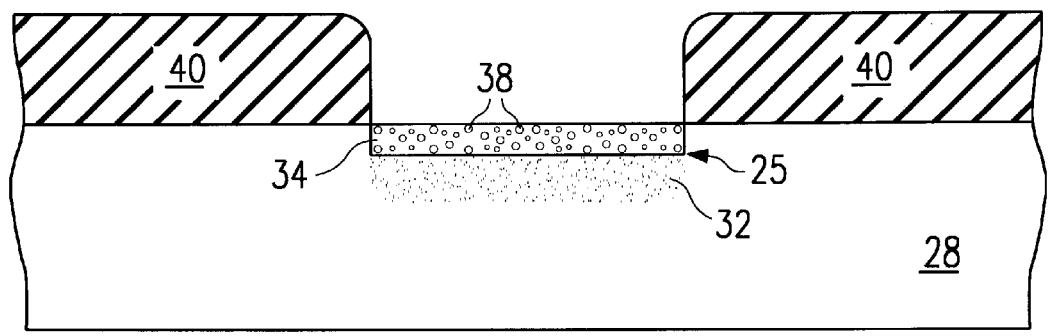
FIG. 4 is a schematic representation of the dopant material diffused in the germanium film layer to define the junction region.

Next, the dopant is either activated or diffused by an anneal step to cause the dopant material to become electrically active in the Ge film layer 34, as shown in FIG. 4. Because the activation temperature of many impurities 38 in Ge is very low compared to the activation temperature for the same dopant in Si, the doped substrate is annealed at low temperatures, e.g. 500° C. The result of this anneal step is that the impurity 38 activates in the substantially pure Ge film 34, but does not appreciably activate in the underlying Si-Ge substrate 32. Thus, the electrically active region is confined to the Ge film only. In this way a $P^+$-N junction 25 can be formed with a junction thickness, $x_j$, defined by the thickness of the Ge film layer 34.

E. Guerrero et al., in the *J. Electrochemical Society*, 129, 1826 (1982) established that the approximate maximum concentration (solid solubility) of arsenic (As) in silicon (Si) is $C_{max}=1.896\times 10^{22}$ exp $$\exp\left[\frac{-453}{RT}\right],$$

which was verified experimentally from 700–1000° C. Assuming the model to be valid at lower temperatures, then $C_{max}$ at 500° C. is approximately $2\times 10^{19} cm^{-3}$ and at 400° C. is approximately $7.8\times 10^{18} cm^{-3}$.

H. Ryssel et al., in *Appl. Phys.*, 22, 35 (1980), measured $C_{max}$ for boron (B) in Si but apparently did not develop a model. It was found that $C_{max}$ for boron in Si at 700° C. is approximately 4 to 10E18 $cm^{-3}$.

R. B. Fair, "Concentration Profiles of Diffused Dopants in Silicon," F. F. Y. Wang, ed., North-Holland, N.Y., 1981, Chapt. 7, provides that for phosphorous (P) in Si, the total concentration, $C_T$, equals approximately $n+2.4\times 10^{-41} n^3$ for temperatures between approximately 900–1050° C., where "n" is the electron concentration. For example, n is approximately equal to $C_T$ when $n \leq 1\times 10^{20} cm^{-3}$.

According to another source, *VLSI Technology*, ed. S. M. Sze, McGraw-Hill, N.Y. 1983, Chapt 6, the percentage of electrically active boron atoms (percent activation) appears to be somewhat dose dependent. For example, percent activation equals approximately 0.02 for 2E15 $cm^{-2}$ at 400°

C., and 0.05 at 600° C. However, for an implant dose of 2.5 E14 cm$^{-2}$, the percent activation equals 0.06 at 400° C., and about .15 at 600° C. For 8×10$^{12}$ cm$^{-2}$, percent activation equals approximately 0.5 at 400° C., and 0.6 at 600° C.

Accordingly, for boron and phosphorous, worst case activation is at approximately 400° C., with percent activation equal to 0.002 when implanted at optimum substrate temperatures. These activation characteristics indicate that reliance on the differential activation temperatures in the inventive process (specifically the formation of the Ge layer, subsequent implant and anneal) would not work sufficiently until the background concentration, $N_B$, of the dopant in the channel or well areas is greater than or equal to approximately 1×10$^{18}$cm$^{-3}$. Thus, relying on differential activation to form shallow junctions in Si MOSFET channels and bipolar collectors and bases is not practical for present-day transistors but may be useful for very deep sub-micron MOSFETs and for present-day Zener diodes and thyristors. Preferably, in light of the above with respect to the activation characteristics, the low temperature differential diffusion rates of the various dopants in Ge as compared to Si can be relied upon to confine the dopant to the Ge film to limit the junction depth. Since the dopants diffuse much more quickly in Ge than they do in Si, a low temperature anneal process can be used to diffuse the dopant through the Ge layer and result in a well defined junction interface with minimal unwanted lateral diffusion, as shown in FIG. 4. The dopant source might be from poly-silicon or from a dielectric, such as SiO$_2$, which is known in the art.

The following table sets forth commonly known data showing the approximate differential diffusion rates between Ge and Si for various dopant materials. It should be noted that as the temperature decreases, the differential diffusion rate for boron decreases, while the differential diffusion rate for phosphorous and arsenic increases. $D_{Ge}$ is the diffusion-rate for Ge. $D_{Si}$ is the diffusion rate for Si. The data for the table is obtained from D. L. Kendall and D. B. De Vries, "Diffusion in Silicon," in R. R. Haberecht and E. L. Kern, Eds. *Semiconductor Silicon*, Electrochemical Society, N.Y., 1969, p. 358 and R. M. Burger and R. P. Donavan, Eds., *Fundamentals of Silicon Integrated Device Technology*, Vol. 1, Prentice-Hall, Englewood Cliffs, N.J., 1967.

| | $D_{Ge}/D_{Si}$ | | |
|---|---|---|---|
| Dopant | 1000° C. | 800° C. | 700° C. |
| boron | 4E4 | 1E4 | 4E3 |
| phosphorous | 3E4 | 2E5 | 7E5 |
| arsenic | 9E5 | 8E6 | 3E7 |

The differential diffusion ratios for antimony (Sb) are similar to that of As.

If diffusion proceeds from a limited dopant source supplied at the surface, the concentration of the dopant at a certain depth "x" given a time "t" is provided by the equation $C(x,t)=Q_T/(sqrt(\pi*D*t)) \exp(-x^2)/(4Dt)$, where $Q_T$ is the total concentration of the source, and D is the diffusion coefficient. The above equation is based on standard theory.

Examples of the diffusion of a dopant through the Ge layer of a given thickness and during an anneal at a given temperature for a given time are provided below. For a 200 Å thick layer of Ge with a rapid thermal anneal of 3 seconds at 1000° C., C(200Å, 3 s)=0.992. This means that the boron dopant material has diffused (moved) to the bottom of the 200 Å thick layer of Ge to the Si-Ge interface, such that 99.2% of surface concentration is at the interface. In comparison, the boron diffusion length (sqrt(D*t)) in Si after 3 seconds is only 23 Å. This means that while much of the boron is at the interface between the Ge layer and the Si substrate, very little of the boron has migrated across the interface, and if it has, the boron dopant has not diffused far into the Si substrate. This characteristic is the basis for the inventive process, and results in well defined, shallow junctions.

Given the same conditions, after 3 seconds at 700° C., virtually no boron will be present at the interface of the 200 Å Ge layer and the Si. At 800° C. after 3 seconds, 55% of the boron surface concentration is at the interface. In comparison, at 800° C., the boron diffusion length in Si is approximately only 1 Å. In the case of arsenic (As), for a 3 second anneal at 1000° C. into a 200 Å Ge layer, 99.97% of As is at the interface, while the diffusion length of As in Si is approximately 6 Å. Thus the As is very effectively confined to the Ge layer. At 700° C., approximately 51% of As is at the interface after 3 seconds while the Si diffusion length is approximately only 0.02 Å. These data show that the differential diffusion rates between Ge and Si can be utilized to effectively contain the dopant in the Ge layer, thus defining the junction depth to be the same as the thickness of the Ge layer, all while minimizing the harmful migration of the dopant into the Si substrate, both vertically and laterally.

For methods of introducing dopant into the germanium layer using greater than 600° C. processes, the dopant will likely have already saturated the Ge, and, based on the differential diffusion rates, will have only penetrated the silicon a minimal amount. As dopant-introduction process temperatures exceed approximately 850° C., the exposure time during doping will have to be limited in order to obtain the proper saturation of the dopant in the Ge without causing too much diffusion into the surrounding Si. For dopant introduction methods using approximately 400° C. processes, a subsequent anneal will be required to diffuse the impurities throughout the Ge film as per the examples described earlier.

This process allows the fabrication of very shallow junctions, having reproducible depths of approximately 5 to 50 nm, using standard processing technologies. The ability to control the thickness of the Ge film or layer is the limiting factor in how shallow the junctions can be constructed. The ability to form junctions of this depth is crucial for the success of deep sub-micron MOSFET transistors and other devices.

Presently preferred methods of the present invention for forming very shallow junctions has been described with a degree of particularity. This description has been made by way of preferred example. It should be understood, however, that the scope of the present invention is defined by the following claims, and not necessarily by the detailed description of the preferred embodiment.

What is claimed is:

1. A method for making shallow junctions in a silicon substrate of a desired dopant type comprising the steps of:
   a. forming a film layer of germanium having a desired thickness directly on the silicon substrate wherein at least part of said film layer will serve as part of said shallow junctions;
   b. introducing a dopant material to the germanium film layer having a greater diffusivity in germanium than in silicon; and
   c. diffusing said dopant material in said germanium film layer into said silicon substrate to form a very shallow junction.

2. A method for making shallow junctions in a silicon substrate of a desired dopant type comprising the steps of:
   a. forming a film layer of germanium having a desired thickness on the substrate wherein at least part of said film layer will serve as part of said shallow junctions;
   b. introducing a dopant material to the germanium film layer; and
   c. diffusing said dopant material in said germanium film layer;
   d. wherein the forming step further comprises the steps of:
      i. implanting germanium into the silicon substrate to form a silicon and germanium alloy;
      ii. oxidizing the silicon and germanium alloy to form a substantially pure germanium layer above the silicon substrate, and an oxide layer above said germanium layer; and
      iii. removing said oxide layer to expose said germanium layer.

3. A method as defined in claim 2, wherein the introducing step further comprises the step of:
   implanting germanium into the silicon substrate to form a silicon and germanium alloy being at least approximately fifty atomic percent germanium.

4. A method as defined in claim 2, wherein the oxidizing step further comprises the step of:
   steam oxidizing at approximately 1000° C.

5. A method as defined in claim 1, wherein the forming step further comprises the step of:
   using a plasma enhanced chemical vapor deposition process.

6. A method as defined in claim 1, wherein the forming step further comprises the step of using a low pressure chemical vapor deposition process.

7. A method for making shallow junctions in a silicon substrate of a desired dopant type comprising the steps of:
   a. forming a film layer of germanium having a desired thickness on the substrate wherein at least part of said film layer will serve as part of said shallow junctions;
   b. introducing a dopant material to the germanium film layer; and
   c. diffusing said dopant material in said germanium film layer;
   d. wherein said forming step further comprises the step of forming a germanium layer having a thickness of equal to or less than 50 nanometers.

8. A method as defined in claim 7, wherein said forming step further comprises the step of:
   forming a germanium layer having a thickness of between approximately 5 nanometers and 50 nanometers.

9. A method as defined in claim 1, wherein said introducing step further includes the step of:
   introducing the doping material through the use of an implanting process.

10. A method for making shallow junctions in a silicon substrate of a desired dopant type comprising the steps of:
    a. forming a film layer of germanium having a desired thickness on the substrate wherein at least part of said film layer will serve as part of said shallow junctions;
    b. introducing a dopant material to the germanium film layer; and
    c. diffusing said dopant material in said germanium film layer;
    d. wherein said introducing step further includes the step of introducing the doping material through the use of an in-situ doped polysilicon.

11. A method for making shallow junctions in a silicon substrate of a desired dopant type comprising the steps of:
    a. forming a film layer of germanium having a desired thickness on the substrate wherein at least part of said film layer will serve as part of said shallow junctions;
    b. introducing a dopant material to the germanium film layer; and
    c. diffusing said dopant material in said germanium film layer;
    d. wherein said introducing step further includes the step of introducing the doping material through the use of an in-situ doped poly germanium.

12. A method for making shallow junctions in a silicon substrate of a desired dopant type comprising the steps of:
    a. forming a film layer of germanium having a desired thickness on the substrate wherein at least part of said film layer will serve as part of said shallow junctions;
    b. introducing a dopant material to the germanium film layer; and
    c. diffusing said dopant material in said germanium film layer;
    d. wherein said introducing step and said diffusion step are performed simultaneously.

13. A method for making shallow functions in a silicon substrate of a desired dopant type comprising the steps of:
    a. forming a film layer of germanium having a desired thickness on the substrate wherein at least part of said film layer will serve as part of said shallow junctions;
    b. introducing a dopant material to the germanium film layer; and
    c. diffusing said dopant material in said germanium film layer;
    d. wherein said introducing step is performed at approximately 400° C., and said diffusion step is performed at approximately 900° C. or higher.

14. A method as defined in claim 1, further including the step of forming $Si_xGe_{1-x}$ using UHVCVD to form said layer of germanium.

15. A method as defined in claim 1, further including the step of forming $Si_xGe_{1-x}$ using epitaxial chemical vapor deposition to form said layer of germanium.

16. A method for making shallow junctions of a desired dopant type in a first semiconductive material comprising the steps of:
    a. forming a film layer of a second semiconductive material on a semiconductor substrate formed of said first semiconductive material wherein at least part of said film layer will serve as part of said shallow junctions;
    b. introducing said dopant material to said second material film layer, said dopant having a higher diffusivity in said second material than in said first material; and
    c. diffusing said dopant material into said second material film layer and into said first material to provide said shallow junction between said first and second materials.

17. A method for making shallow junctions of a desired dopant type in a first material comprising the steps of:
    a. forming a film layer of a second material on a substrate formed of said first material wherein at least part of said film layer will serve as part of said shallow junctions;
    b. introducing said dopant material to said second material film layer, said dopant having a higher diffusivity in said second material than in said first material; and c. diffusing said dopant material in said second material film layer;

d. introducing a second dopant material to the second material film layer, said second dopant material having a higher diffusivity in said second material than in said first material; and e. diffusing said second dopant material in said second material film layer.

18. A method for making shallow junctions of a desired dopant type in a first semiconductive material comprising the steps of:

a. forming a film layer of a second semiconductive material on a semiconductor substrate formed of said first semiconductive material wherein at least part of said film layer will serve as part of said shallow junctions;

b. introducing said dopant material to said second material film layer, said dopant having a higher diffusivity in said second material than in said first material; and c. diffusing said dopant material in said second material film layer;

d. implanting second material into the fist material substrate to form an alloy of said first and second materials;

e. oxidizing the alloy to form a substantially pure layer of said second material above said first material substrate, and an oxide layer above said second material layer; and f. removing said oxide layer to expose said second material layer.

19. A method for making shallow junctions of a desired dopant type in a first material comprising the steps of:

a. forming a film layer of a second material on a substrate formed of said first material;

b. introducing said dopant material to said second material film layer, said dopant having a higher differential activation percentage in said second material than in said first material; and c. activating said dopant in said second material at a temperature selected such that there is no substantial dopant activation in said first material.

* * * * *